United States Patent [19]

Gardner et al.

[11] Patent Number: 5,780,340
[45] Date of Patent: Jul. 14, 1998

[54] METHOD OF FORMING TRENCH TRANSISTOR AND ISOLATION TRENCH

[75] Inventors: Mark I. Gardner, Cedar Creek; Daniel Kadosh, Austin; Jon D. Cheek, Round Rock, all of Tex.

[73] Assignee: Advanced Micro Devices, Inc., Sunnyvale, Calif.

[21] Appl. No.: 739,566

[22] Filed: Oct. 30, 1996

[51] Int. Cl.$^6$ .................................................. H01L 21/336
[52] U.S. Cl. ........................ 438/259; 438/256; 438/257; 438/430; 438/424
[58] Field of Search ............................ 438/296, 257, 438/259, 430, 424, 227

[56] References Cited

U.S. PATENT DOCUMENTS

| | | | |
|---|---|---|---|
| 4,745,086 | 5/1988 | Parillo et al. | 437/57 |
| 4,830,975 | 5/1989 | Bovaird et al. | 438/296 |
| 5,094,973 | 3/1992 | Pang | 437/67 |
| 5,141,891 | 8/1992 | Arima et al. | 437/44 |
| 5,166,084 | 11/1992 | Pfiester | 437/40 |
| 5,175,118 | 12/1992 | Yoneda | 437/40 |
| 5,231,038 | 7/1993 | Yamaguchi et al. | 437/40 |
| 5,451,804 | 9/1995 | Lur et al. | 257/330 |
| 5,504,031 | 4/1996 | Hsu et al. | 437/57 |
| 5,512,506 | 4/1996 | Chang et al. | 437/44 |
| 5,538,913 | 7/1996 | Hong | 437/44 |
| 5,545,579 | 8/1996 | Liang et al. | 437/44 |
| 5,554,550 | 9/1996 | Yang | 438/259 |
| 5,567,635 | 10/1996 | Acovic et al. | 437/43 |
| 5,571,738 | 11/1996 | Krivokapic | 438/296 |
| 5,574,302 | 11/1996 | Wen et al. | 257/330 |
| 5,610,091 | 3/1997 | Cho | 438/259 |
| 5,640,034 | 6/1997 | Malhi | 257/341 |

FOREIGN PATENT DOCUMENTS

| | | | |
|---|---|---|---|
| 117465 | 5/1988 | Japan | 438/227 |
| 64-4058 | 1/1989 | Japan . | |
| 68965 | 3/1989 | Japan | 438/227 |
| 2-22868 | 1/1990 | Japan . | |

*Primary Examiner*—Trung Dang
*Attorney, Agent, or Firm*—Skjerven, Morrill, MacPherson, Franklin & Friel, LLP; David M. Sigmond

[57] ABSTRACT

An IGFET with a gate electrode in a transistor trench adjacent to an isolation trench is disclosed. The trenches are formed in a semiconductor substrate. A gate insulator is on a bottom surface of the transistor trench, insulative spacers are adjacent to opposing sidewalls of the transistor trench, and the gate electrode is on the gate insulator and spacers and is electrically isolated from the substrate. Substantially all of the gate electrode is within the transistor trench. A source and drain in the substrate are beneath and adjacent to the bottom surface of the transistor trench. The isolation trench is filled with an insulator and provides device isolation for the IGFET. Advantageously, the trenches are formed simultaneously using a single etch step.

25 Claims, 5 Drawing Sheets

5,780,340

METHOD OF FORMING TRENCH TRANSISTOR AND ISOLATION TRENCH

BACKGROUND OF THE INVENTION

1. Field of the Invention

The present invention relates to integrated circuits, and more particularly to insulated-gate field-effect transistors.

2. Description of Related Art

An insulated-gate field-effect transistor (IGFET), such as a metal-oxide semiconductor field-effect transistor (MOSFET), uses a gate electrode to control an underlying surface channel joining a source and drain. The channel, source and drain are located in a semiconductor substrate, with the substrate being doped oppositely to the source and drain. The gate electrode is separated from the semiconductor substrate by a thin insulating layer such as a gate oxide. The operation of the IGFET involves application of an input voltage to the gate electrode, which sets up a transverse electric field in the channel in order to modulate the longitudinal conductance of the channel.

In typical IGFET processing, the source and drain are formed by introducing dopants of a second conductivity type (P or N) into the semiconductor substrate of a first conductivity type (N or P) using a patterned gate electrode as a mask. This self-aligning procedure tends to improve packing density and reduce parasitic overlap capacitances between the gate electrode and the source/drain regions.

Polysilicon (also called polycrystalline silicon, poly-Si or poly) thin films have many important uses in IGFET technology. One of the key innovations is the use of heavily doped polysilicon as the gate electrode in place of aluminum. Since polysilicon has the same high melting point as a silicon substrate, it can be deposited prior to source and drain formation, and serve as a mask during introduction of the source and drain regions by ion implantation. The resistance of polysilicon can be further reduced by forming a silicide on its top surface.

There is a relentless trend to miniaturize semiconductor dimensions. The number of IGFETs that can be manufactured on an integrated circuit chip can be increased by decreasing the horizontal dimensions. Resolution refers to the horizontal linewidth or space that a lithographic system can adequately print or resolve. Lithographic systems include optical projection and step and repeat equipment, and electron beam lithography equipment. In optical systems, for instance, resolution is limited by the equipment (e.g., diffraction of light, lens aberrations, mechanical stability), optical properties of the photoresist (e.g., resolution, photosensitivity, index of refraction), and process characteristics (e.g., softbake step, develop step, postbake step, and etching step).

The planarization of semiconductor wafers is becoming increasingly important as the number of layers used to form integrated circuits increases. For instance, the gate electrode and/or metallization layers formed to provide interconnects between various devices may result in nonuniform surfaces. The surface nonuniformities may interfere with the optical resolution of subsequent lithographic steps, leading to difficulty with printing high resolution patterns. The surface nonuniformities may also interfere with step coverage of subsequently deposited metal layers and possibly cause open circuits.

IGFETs are generally electrically isolated from one another in the substrate to prevent spurious channels from forming between them, and selected IGFETs are interconnected by an overlying metallization pattern. An isolation technique termed LOCOS (for LOCalized Oxidation of Silicon) involves the thermal growth of recessed field oxides in field regions between adjacent IGFETs. Prior to growing the field oxides, a thin layer of silicon nitride covers the active regions and exposes the field regions, and ion implantation provides a channel-stop implant that is self-aligned to the field regions. The channel-stop implant increases doping under the field oxides to ensure the threshold voltage of parasitic devices is greater than any operating voltage. Thick field oxides render the channel-stop implant unnecessary, but are generally not used to reduce step coverage problems. For submicron IGFETs, LOCOS-based techniques are often replaced by trench-based isolation schemes. For instance, with shallow trench and refill isolation, a trench on the order of 3000 to 5000 angstroms deep is anisotropically etched into the silicon substrate, a short thermal oxidation is applied to control the interface quality on the trench walls, an insulative material is filled into the trench, and the surface is planarized using chemical-mechanical polishing.

Deep trench isolation is also known in the art. Trench-based isolation provides smaller isolation spacing than is possible with LOCOS. In addition, the fully recessed structure provides a planar top surface, and the sharp lower corners provide improved isolation efficiency due to the so called "corner effect." A drawback to trench-based isolation, however, is the need for additional processing steps dedicated solely to forming the trenches.

Accordingly, a need exists for an IGFET that can be manufactured with reduced horizontal dimensions and a substantially planar top surface in conjunction with an efficient technique for providing device isolation. It is especially desirable that the IGFET have a channel length that can be significantly smaller than the minimum resolution of the available lithographic system.

SUMMARY OF THE INVENTION

The present invention provides an insulated-gate field-effect transistor (IGFET) with a gate electrode in a transistor trench (i.e., a trench transistor) adjacent to an isolation trench. A gate insulator is on the bottom surface of the transistor trench, spacers are adjacent to opposing sidewalls of the transistor trench, and the gate electrode is on the gate insulator and spacers. A source and drain are adjacent to the bottom surface of the transistor trench. If the trench length corresponds to the minimum resolution of a lithographic system, then the channel length is significantly smaller than the minimum resolution. Furthermore, the gate electrode is substantially aligned with the top surface of the substrate, and substantially all of the gate electrode is within the trench. In this manner, a highly miniaturized IGFET can be produced.

A key feature of the invention is simultaneously forming the transistor trench and the isolation trench using a single etch step, thereby improving process efficiency.

According to one aspect of the invention, a method of forming an IGFET and an isolation trench includes simultaneously forming a transistor trench and an isolation trench in a substrate, wherein the transistor trench includes first and second opposing sidewalls and a first bottom surface and the isolation trench includes third and fourth opposing sidewalls and a bottom surface, forming first and second spacers adjacent to the first and second sidewalls, forming a gate insulator on the first bottom surface, forming a gate electrode on the gate insulator and spacers, and forming a source and a drain adjacent to the first bottom surface.

3

In an embodiment of the method, forming the first and second spacers includes depositing a first oxide layer over the substrate and into the trenches and then applying an anisotropic etch that forms third and fourth spacers adjacent to the third and fourth sidewalls, forming the gate insulator includes growing a gate oxide on a central portion of the first bottom surface and an oxide region on a central portion of the second bottom surface, forming the gate electrode includes depositing a polysilicon layer over the substrate and into the trenches and then applying polishing to provide a polysilicon gate electrode in the transistor trench and a polysilicon region in the isolation trench. The method may also include removing the polysilicon region from the isolation trench, depositing a second oxide layer over the substrate and into the isolation trench, and then planarizing the second oxide layer so that the isolation trench is filled with oxide.

Preferably, the source includes a lightly doped region beneath and adjacent to the first bottom surface that provides a first channel junction and a heavily doped region adjacent to the first sidewall and the top surface of the substrate, and the drain includes a lightly doped region beneath and adjacent to the first bottom surface that provides a second channel junction and a heavily doped region adjacent to the second sidewall and the top surface. The source/drain doping can be provided before, after, or both before and after the trenches are formed. It is also preferred that the trenches have essentially identical lengths and depths.

A primary advantage of the invention is that the IGFET can have a channel length that is significantly smaller than the minimum resolution of the available lithographic system, thereby providing a next generation transistor with the present generation lithography. In addition, the gate electrode is substantially aligned with the top surface of the substrate, and the isolation trench is formed without additional processing steps.

These and other aspects, features and advantages of the invention will be further described and more readily apparent from a review of the detailed description of the preferred embodiments which follow.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
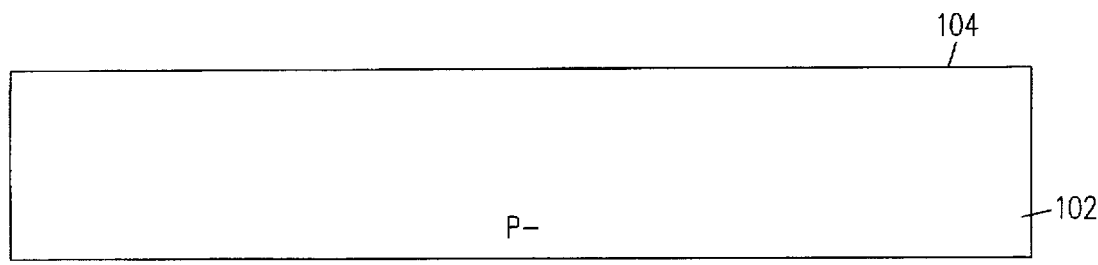
FIGS. 1A–1Q show cross-sectional views of successive process steps for forming an IGFET adjacent to an isolation trench in accordance with an embodiment of the invention.

In the drawings, depicted elements are not necessarily drawn to scale and like or similar elements may be designated by the same reference numeral throughout the several views.

In FIG. 1A, semiconductor substrate 102 suitable for integrated circuit manufacture is provided. Substrate 102 includes a P-epitaxial surface layer with a <100>orientation, a boron concentration of $1 \times 10^{15}$ atoms/cm$^3$ and a resistivity of 12 ohm-cm. Preferably, the epitaxial surface layer is disposed on a P+base layer (not shown). The epitaxial surface layer has a planar top surface 104.

Figure 1B:
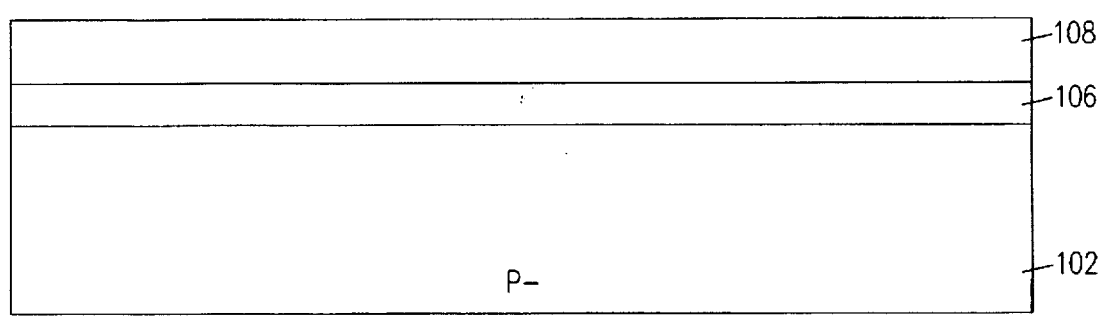

In FIG. 1B, a blanket layer of silicon dioxide (SiO$_2$) is deposited by chemical vapor deposition to form oxide layer 106 on substrate 102. Oxide layer 106 has a thickness of 500 angstroms. Thereafter, a blanket layer of silicon nitride (Si$_3$N$_4$) is deposited by chemical vapor deposition to form nitride layer 108 on oxide layer 106. Nitride layer 108 has a thickness of 1000 angstroms.

Figure 1C:
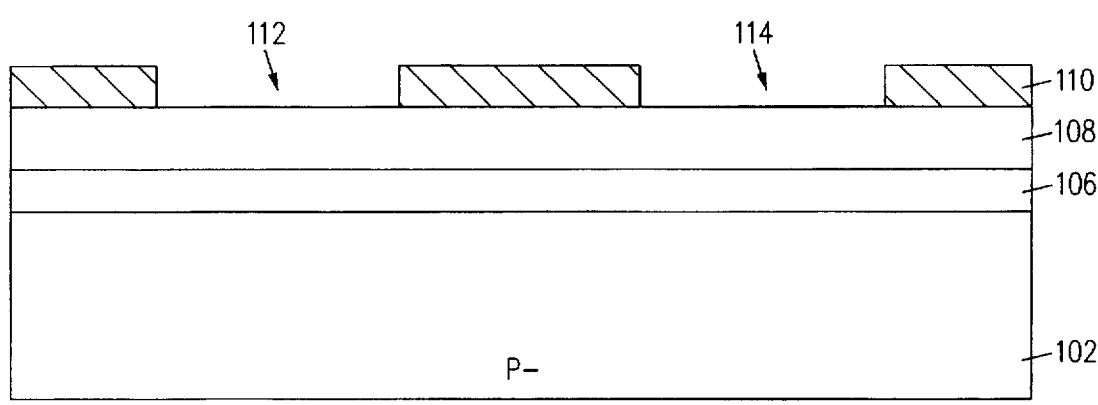

In FIG. 1C, photoresist layer 110 is deposited as a continuous layer on nitride layer 108 and then selectively irradiated using a photolithographic system, such as a step and repeat optical projection system, in which I-line ultraviolet light from a mercury-vapor lamp is projected through a reticle and a focusing lens to project the desired image pattern on photoresist layer 110.

Thereafter, photoresist layer 110 is developed and the irradiated portions are removed to provide openings 112 and 114. Opening 112 defines the lateral boundaries for a transistor trench, and opening 114 that defines the lateral boundaries for an isolation trench. The minimum resolution (i.e. linewidth and spacing) of the step and repeat system is 4000 angstroms (0.4 microns).

Therefore, to reduce feature sizes, openings 112 and 114 are spaced by 4000 angstroms, and the length of openings 112 and 114 is 4000 angstroms.

Figure 1D:
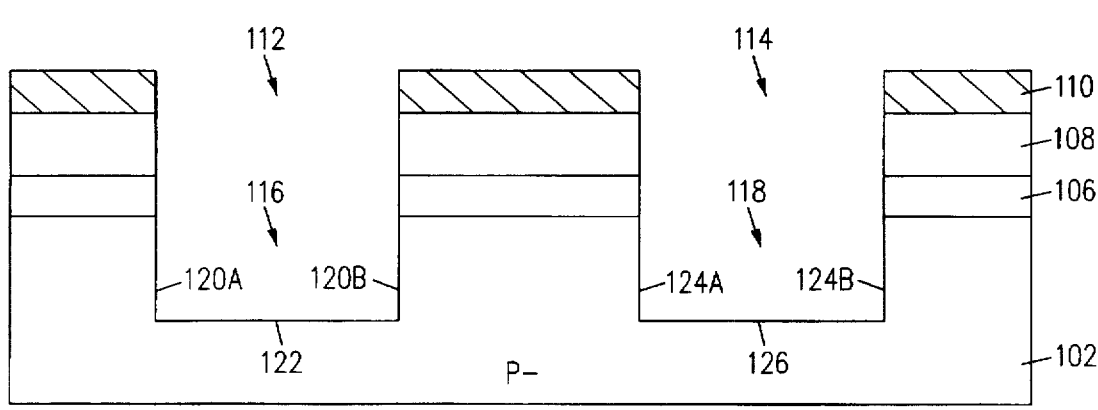

In FIG. 1D, an anisotropic etch is provided by applying a reactive ion etch using photoresist layer 110 as an etch mask. The etch completely removes the portions of nitride layer 108 and oxide layer 106 beneath openings 112 and 114. The etch also removes upper portions of substrate 102 beneath openings 112 and 114 to form transistor trench 116 and isolation trench 118 partially through substrate 102. Transistor trench 116 includes opposing vertical sidewalls 120A and 120B and planar bottom surface 122, and isolation trench 118 includes opposing vertical sidewalls 124A and 124B and planar bottom surface 126. Transistor trench 116 has a depth (or height) of 2000 angstroms between top surface 104 and bottom surface 122, and a length of 4000 angstroms between sidewalls 120A and 120B. Likewise, isolation trench 118 has a depth (or height) of 2000 angstroms between top surface 104 and bottom surface 126, and a length of 4000 angstroms between sidewalls 124A and 124B. Sidewalls 120B and 124A are spaced by 4000 angstroms.

Figure 1E:
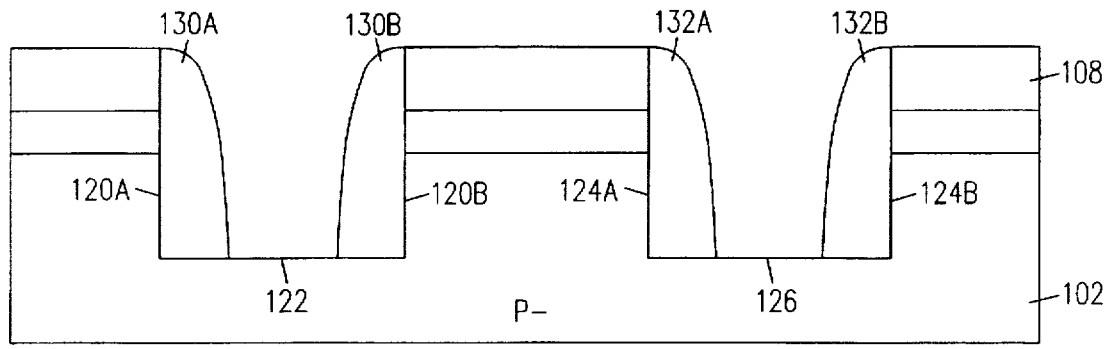

In FIG. 1E, photoresist layer 110 is stripped, and a blanket layer of silicon dioxide that is 2500 angstroms thick is conformally deposited over substrate 102 and fills trenches 116 and 118.

Thereafter, an anisotropic etch is provided by a reactive ion etch that is highly selective of silicon 2 0 dioxide with respect to silicon nitride and silicon. The etch forms oxide spacers 130A and 130B in transistor trench 116, and oxide spacers 132A and 132B in isolation trench 118. Oxide spacers 130A and 130B extend to the top surface of nitride layer 108, contact and completely cover sidewalls 120A and 120B, respectively, contact and cover outer portions of bottom surface 122 adjacent to sidewalls 120A and 120B, respectively, but leave exposed a central portion of bottom surface 122 between and adjacent to the outer portions. Oxide spacers 130A and 130B each have a length of 1200 angstroms along the outer portions of bottom surface 122. Therefore, the central portion of bottom surface 122 has a length of 1600 angstroms (4000–2400 angstroms), and is spaced from sidewalls 120A and 120B by 1200 angstroms. Likewise, oxide spacers 132A and 132B extend to the top surface of nitride layer 108, contact and completely cover sidewalls 124A and 124B, respectively, contact and cover outer portions of bottom surface 126 adjacent to sidewalls 124A and 124B, respectively, but leave exposed a central portion of bottom surface 126 between and adjacent to the outer portions. Oxide spacers 132A and 132B each have a length of 1200 angstroms along the outer portions of bottom surface 126. Therefore, the central portion of bottom surface 126 has a length of 1600 angstroms (4000–2400 angstroms), and is spaced from sidewalls 124A and 124B by 1200 angstroms.

The spacer dimensions depend on several factors, including the height and length of the trenches, the thickness of the insulating layers above the substrate, the thickness of the conformal spacer oxide layer, and the duration of the spacer etch. The spacer dimensions are selected to provide the desired scaling of the transistor trench length to a channel length. However, the channel length depends on other factors including the characteristics of subsequent implanted source and drain regions and a high-temperature anneal. Preferably, the channel length is scaled to less than half of the transistor trench length, and is less than 2000 angstroms.

Figure 1F:
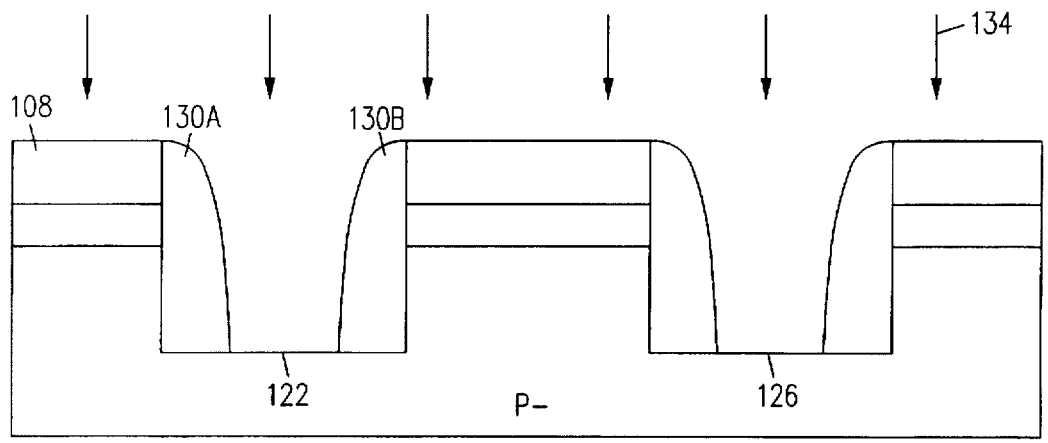

In FIG. 1F, a channel implant provided by boron, as indicated by arrows 134, is implanted through the central portion of bottom surface 122 using nitride layer 108 and oxide spacers 130A and 130B as an implant mask. The channel implant includes a well implant, then a punch-through implant, and then a threshold voltage implant. The well implant provides a more uniform background doping, the punchthrough implant provides the channel with greater robustness to punchthrough voltages, and the threshold voltage implant sets the threshold voltage of the IGFET to approximately 0.4 to 0.7 volts. The well implant is provided by boron at a dose in the range of $1\times10^{12}$ to $1\times10^{13}$ atoms/cm$^2$ and an energy in the range of 100 to 170 kiloelectron-volts, the punchthrough implant is provided by boron at a dose in the range of $1\times10^{12}$ to $1\times10^{13}$ atoms/cm$^2$ and an energy in the range of 40 to 100 kiloelectron-volts, and the threshold voltage implant is provided by boron at a dose in the range of $1\times10^{12}$ to $1\times10^{13}$ atoms/cm$^2$ and an energy in the range of 2 to 30 kiloelectron-volts. The channel implant has a boron concentration on the order of $1\times10^{17}$ atoms/cm$^3$ and provides suitable doping for a channel adjacent to bottom surface 122. A similar boron doping profile is provided beneath bottom surface 126, although it is unnecessary.

Figure 1G:
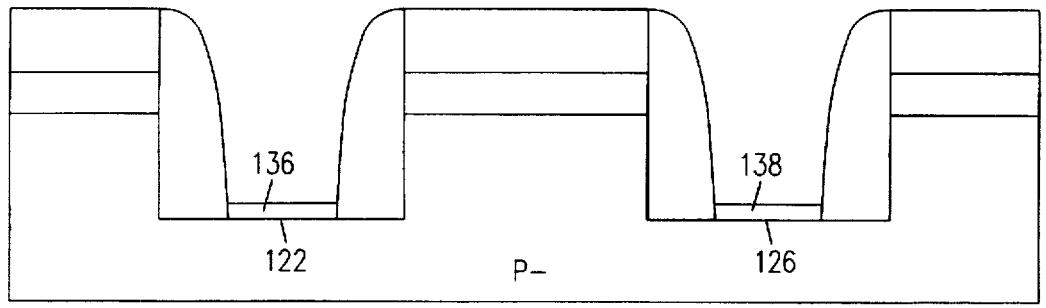

In FIG. 1G, a high quality layer of silicon dioxide is thermally grown on the exposed silicon surfaces using tube growth at a temperature of 700 to 1000° C. in an $O_2$ containing ambient. As a result, gate oxide 136 with a thickness of 50 angstroms is formed on the central portion of bottom surface 122, and oxide region 138 with a thickness of 50 angstroms is formed on the central portion of bottom surface 126.

Figure 1H:
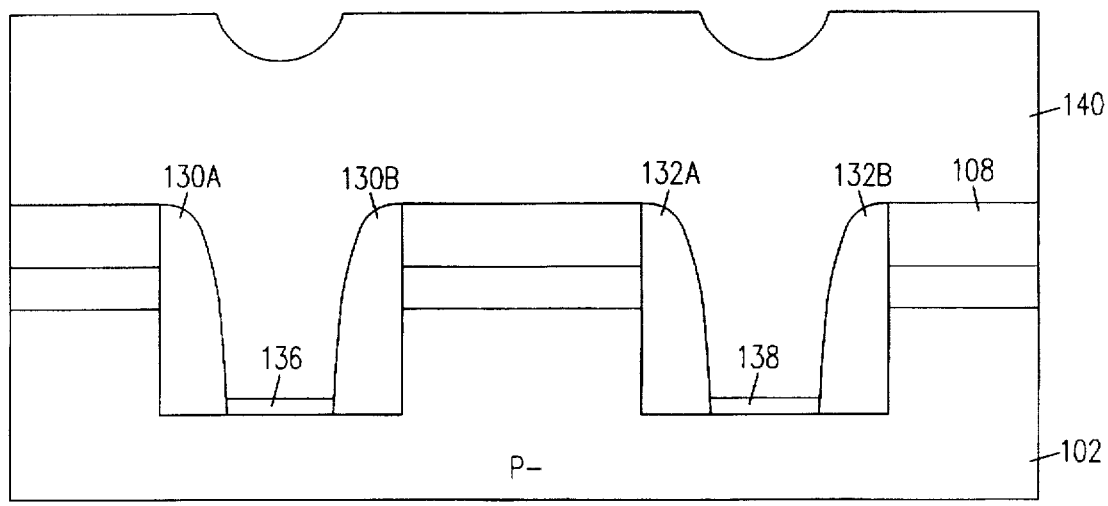

In FIG. 1H, a blanket layer of undoped polysilicon 140 with a thickness of 4000 angstroms is deposited by low pressure chemical vapor deposition over substrate 102. Thus, polysilicon 132 is deposited on oxide spacers 130A, 130B, 132A and 132B, on gate oxide 136 and oxide region 138, and on nitride layer 108. Polysilicon 140 fills the remaining space in trenches 116 and 118.

Figure 1I:
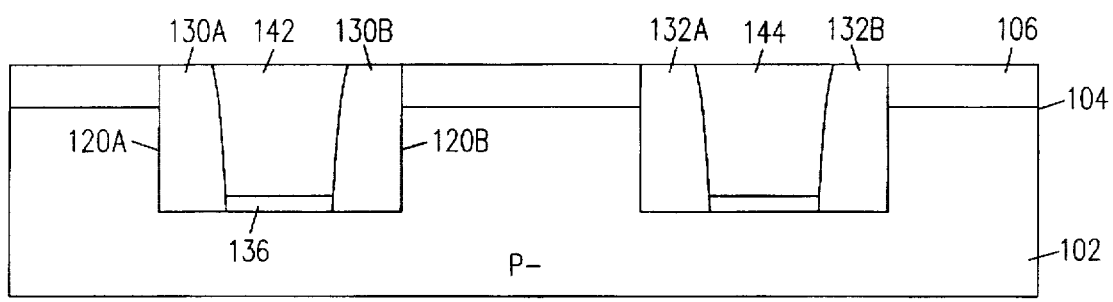

In FIG. 1I, the structure is planarized by applying chemical-mechanical polishing in the presence of an abrasive slurry that is highly selective of polysilicon with respect to silicon dioxide. The polishing grinds down polysilicon 140 along with nitride layer 108 and upper regions of oxide spacers 130A, 130B, 132A and 132B, removes nitride layer 108, and is discontinued using oxide layer 106 as a stop-layer before reaching top surface 104. The remaining portions of polysilicon 140 forms polysilicon gate electrode 142 in transistor trench 116, and polysilicon region 144 in isolation trench 118. The top surfaces of oxide layer 106, oxide spacers 130A, 130B, 132A and 132B, polysilicon gate electrode 142 and polysilicon region 144 are aligned and form a planar surface. Polysilicon gate electrode 142 extends a few hundred angstroms above top surface 104, and therefore is substantially aligned with top surface 104. All of polysilicon gate 142 is within the length of transistor trench 116 (between sidewalls 120A and 120B), and substantially all of polysilicon gate electrode 142 is within transistor trench 116. Of importance, polysilicon gate electrode 142 is spaced from substrate 102 by oxide spacers 130A and 130B and gate oxide 136. No portion of polysilicon gate electrode 142 (or polysilicon region 144) contacts substrate 102 or overlaps top surface 104.

Figure 1J:
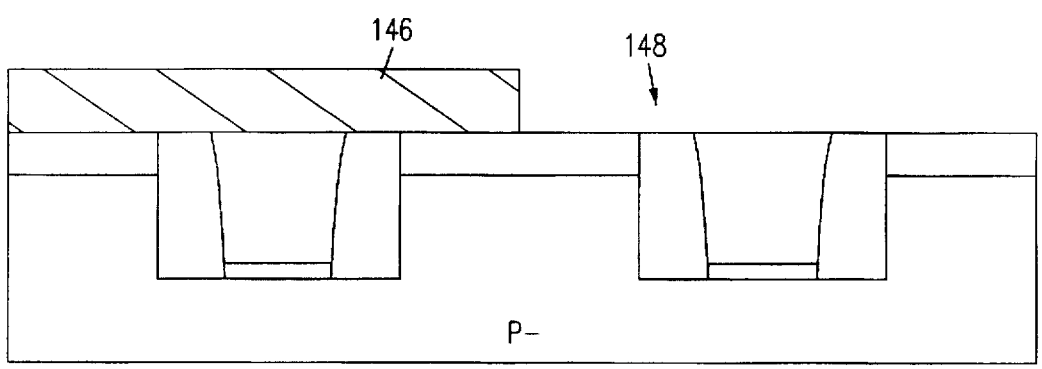

In FIG. 1J, photoresist layer 146 is deposited as a continuous layer over substrate 102 and then selectively irradiated using the step and repeat system. Thereafter, photoresist layer 146 is developed and the irradiated portions are removed to provide opening 148 above isolation trench 118 while photoresist layer 146 covers transistor trench 116.

Figure 1K:
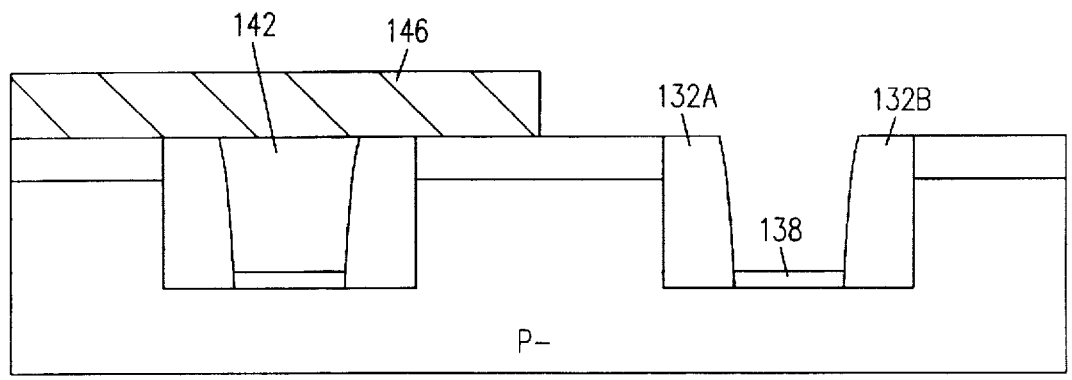

In FIG. 1K, an anisotropic etch is provided by a reactive ion etch using photoresist layer 146 as an etch mask. The etch is highly selective of polysilicon with respect to silicon dioxide. As a result, the etch completely removes polysilicon region 144 from isolation trench 118. Thus, oxide spacers 132A and 132B and oxide region 138 become re-exposed. Polysilicon gate electrode 142 is protected from the etch by photoresist layer 146.

Figure 1L:
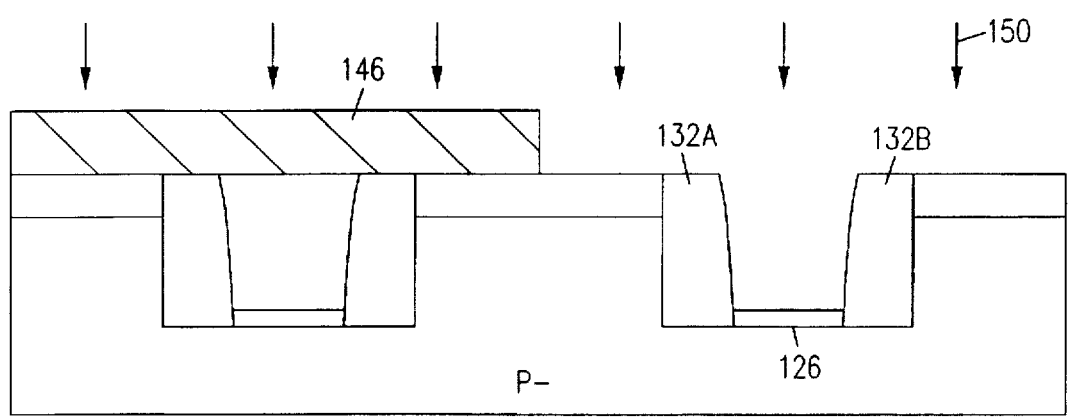

In FIG. 1L, a channel-stop implant provided by boron, as indicated by arrows 150, is implanted through the central portion of bottom surface 126 using photoresist layer 146 and oxide spacers 132A and 132B as an implant mask. The channel-stop implant is provided by boron at a dose in the range of $5\times10^{12}$ to $1\times10^{13}$ atoms/cm$^2$ and an energy in the range of 100 to 200 kiloelectron-volts, and has a boron concentration on the order of $5\times10^{17}$ atoms/cm$^3$. The channel-stop implant provides suitable doping to reduce or eliminate spurious channels that might otherwise arise beneath isolation trench 118 between adjacent IGFETs during operation.

Figure 1M:
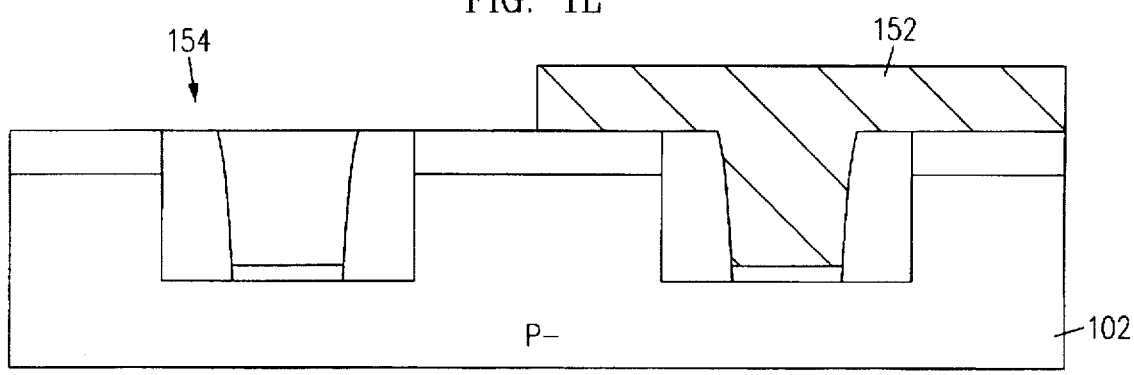

In FIG. 1M, photoresist layer 146 is stripped, and photoresist layer 152 is deposited as a continuous layer over substrate 102 and then selectively irradiated using the step and repeat system. Thereafter, photoresist layer 152 is developed and the irradiated portions are removed to provide opening 154 above transistor trench 118 while photoresist layer 152 covers isolation trench 118.

Figure 1N:
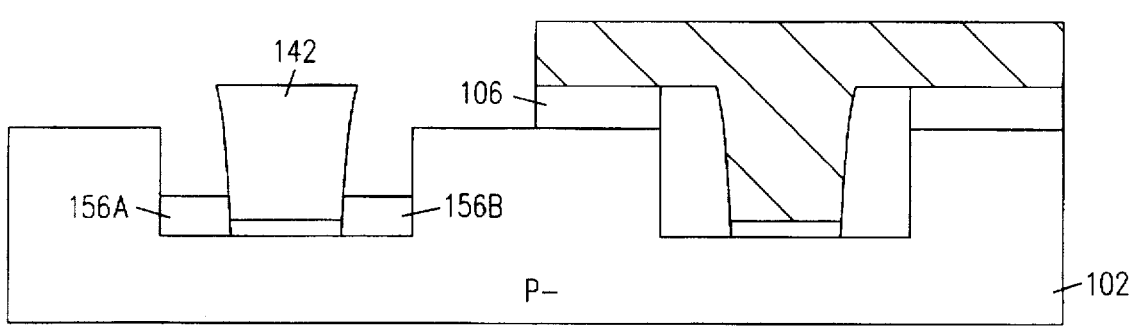

In FIG. 1N, a wet etch that is highly selective of silicon dioxide is applied to partially remove oxide spacers 130A and 130B without attacking polysilicon gate electrode 142 or substrate 102. The wet etch removes the exposed regions of oxide layer 106. The wet etch also removes upper portions of oxide spacers 130A and 130B, creating voids extending partially through transistor trench 116, but leaves intact the lower 500 angstroms of oxide spacers 130A and 130B, shown as lower oxide spacer portions 156A and 156B, respectively. Preferably, the wet etch provides a precisely controlled oxide removal rate to accurately control the heights of lower oxide spacer portions 156A and 156B.

Figure 1O:
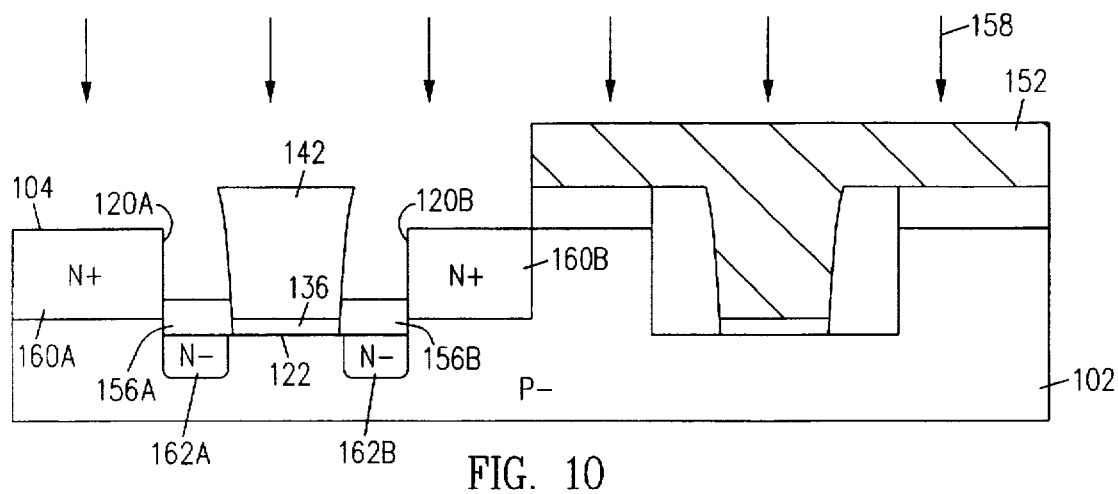

In FIG. 1O, substrate 102 is subjected to ion implantation of arsenic, indicated by arrows 158, at a heavy dosage in the range of $1\times10^{15}$ to $5\times10^{15}$ atoms/cm$^2$ and an energy in the range of 2 to 80 kiloelectron-volts. The arsenic implant provide heavy doping for polysilicon gate electrode 142. The arsenic implant introduces sidewall source region 160A and sidewall drain region 160B into substrate 102, adjacent to top surface 104, adjacent to sidewalls 120A and 120B, respectively, and spaced from bottom surface 122. Sidewall source region 160A and sidewall drain region 160B are doped N+ with an arsenic concentration in the range of $1 \times 10^{20}$ to $1 \times 10^{21}$ atoms/cm$^3$ and a depth of 1800 angstroms beneath top surface 104. The arsenic implant also introduces localized source region 162A and localized drain region 162B into substrate 102, adjacent to the outer portions of bottom surface 122, adjacent to sidewalls 120A and 120B, respectively, spaced from sidewall source and drain regions 160A and 160B, respectively, and spaced slightly from gate oxide 136. Localized source region 162A and localized drain region 162B are doped N- with an arsenic concentration in the range of $5 \times 10^{17}$ to $5 \times 10^{18}$ atoms/cm$^3$ and a depth of 1000 angstroms beneath bottom surface 122. During the implantation, polysilicon gate electrode 142 provides an implant mask for the central portion of bottom surface 122, whereas, for arsenic ions passing through the voids in transistor trench 116, lower oxide spacer portions 156A and 156B provide a partial implant mask for the outer portions of bottom surface 122. That is, lower oxide spacer portions 156A and 156B block a substantial amount of the arsenic ions impinging thereon from reaching substrate 102, but also allow a substantial amount of the arsenic ions impinging thereon to pass into substrate 102. In this manner, lower oxide spacer portions 156A and 156B control the doping concentration of localized source region 162A and localized drain region 162B by permitting passage of some but not all of the arsenic ions impinging thereon into the underlying portions of substrate 102. During the implantation, photoresist layer 152 also provides an implant mask for the underlying regions.

Figure 1P:
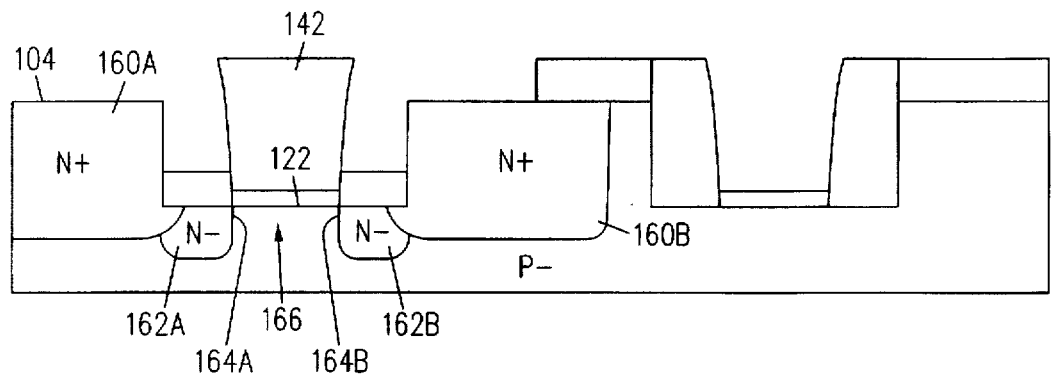

In FIG. 1P, photoresist layer 152 is stripped, and a rapid thermal anneal on the order of 950 to 1050° C. for 10 to 30 seconds is applied to remove crystalline damage and to activate and drive-in the implanted dopants. Sidewall source and drain regions 160A and 160B diffuse slightly beneath bottom surface 122. As a result, source regions 160A and 162A merge to form a source, and drain regions 160B and 162B merge to form a drain. Localized drain region 162B provides a lightly doped drain (LDD). Advantageously, the LDD reduces hot carrier effects during operation as is well known in the art. Furthermore, localized source and drain regions 162A and 162B provide channel junctions 164A and 164B, respectively, which define channel 166. As is seen, channel junctions 164A and 164B and channel 166 are beneath and adjacent to bottom surface 122, and substantially aligned with the bottom surface of polysilicon gate electrode 142. Channel 166 has a length of approximately 1600 angstroms. Sidewall source region 160A and sidewall drain region 160B extend to top surface 104 for receiving source/drain contacts. Accordingly, polysilicon gate electrode 142 controls an N-channel MOSFET with channel 166 between the source and drain.

Figure 1Q:
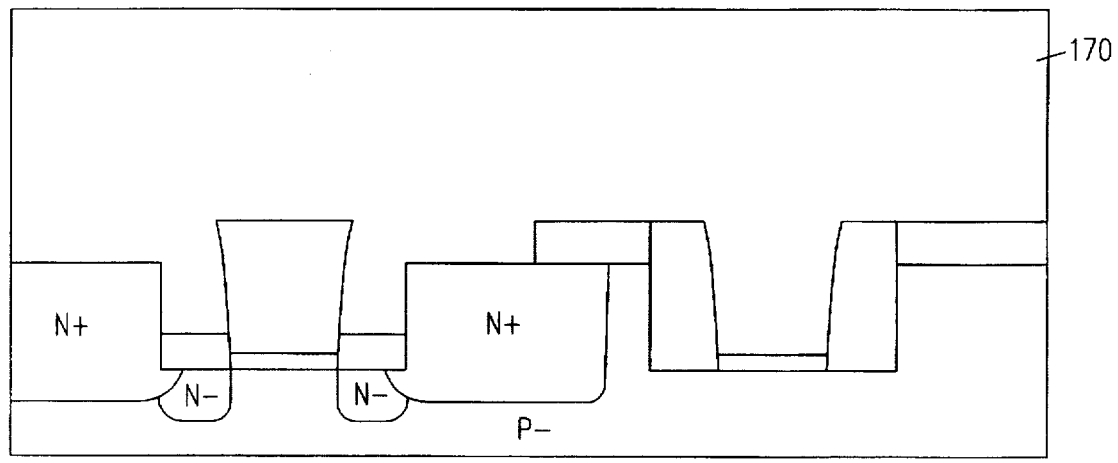

In FIG. 1Q, a blanket layer of silicon dioxide shown as oxide layer 170 with a thickness of 12,000 to 15,000 angstroms is deposited by low pressure chemical vapor deposition over substrate 102. Oxide layer 170 fills the remaining space in isolation trench 118. Thus, isolation trench 1 18 is filled with oxide. Thereafter, the structure is planarized by applying chemical-mechanical polishing in the presence of an abrasive slurry that is highly selective of silicon dioxide. The polishing grinds down oxide layer 170, and is discontinued after removing about 4000 angstroms so that oxide layer 170 has a planar top surface.

Further processing steps in the fabrication of IGFETs typically include forming contact windows in the oxide layer above the source, drain and gate electrode, forming appropriate interconnect metallization in the contact windows, and then forming a passivation layer. In addition, either earlier or subsequent high-temperature process steps can be used to supplement or replace the high-temperature anneal to provide the desired anneal, activation, and diffusion for the implanted dopants. These further processing steps are conventional and need not be repeated herein. Likewise the principal processing steps disclosed herein may be combined with other steps readily apparent to those skilled in the art.

At completion of the process, it is preferred that the channel length be precisely controlled. However, to the extent that the lateral locations of the channel junctions are not (or can not be) precisely controlled, it is far preferable to have a slight overlap between the channel junctions and the bottom surface of the gate electrode as opposed to a lateral displacement or gap. While a slight overlap leads to capacitive effects (known as "Miller capacitance") that tend to reduce switching speeds, a lateral displacement or gap may prevent formation of a conductive channel between the source and the drain during operation. Furthermore, decreasing the channel length increases the drive current. Therefore, the overlap between the gate electrode and the source/drain involves a tradeoff between switching speed and drive current.

The invention includes numerous variations to the embodiment described above. For instance, all source/drain doping can be provided before etching the trenches by implanting a doped layer into the substrate, etching the trenches partially through the doped layer, and using the channel implant to counterdope a portion of the doped layer beneath the central portion of the bottom surface of the transistor trench. Likewise, partial source/drain doping can be provided both before and after etching the trenches by implanting a doped layer into the substrate, etching the transistor completely through the doped layer, implanting a second doped layer through the entire bottom surface of the transistor trench, and using the channel implant to counterdope a portion of the second doped layer beneath the central portion of the bottom surface of the transistor trench. If desired, the source or drain proximate to the isolation trench can contact the isolation trench.

The transistor trench and the isolation trench need not necessarily have essentially identical lengths or depths. Undoped polysilicon can provide an insulator in the isolation trench. An insulator that replaces the polysilicon in the isolation trench can be polished down to the gate electrode. The gate electrode can be various conductors such as aluminum, titanium, tungsten, cobalt, and combinations thereof, although the material may be limited by the use of subsequent high-temperature steps. The gate insulator, spacers, and materials in the isolation trench can be various insulators including silicon dioxide, silicon nitride, and silicon oxynitride. Suitable N-type dopants include arsenic and phosphorus; suitable P-type dopants include boron $B_{10}$, boron $B_{11}$, and $BF_X$ species such as $BF_2$.

Further details regarding trench transistors are disclosed in U.S. application Ser. No. 08/739,593 filed concurrently herewith, entitled "Trench Transistor With Metal Spacers" by Gardner et al.; U.S. application Ser. No. 08/739,595 filed concurrently herewith, entitled "Trench Transistor With Insulative Spacers" by Gardner et al.; U.S. application Ser. No. 08/739,592 filed concurrently herewith, entitled "Trench Transistor With Localized Source/Drain Regions Implanted Through Voids In Trench" by Gardner et al.; U.S. application Ser. No. 08/739,596 filed concurrently herewith, entitled "Trench Transistor With Localized Source/Drain Regions Implanted Through Selectively Grown Oxide Layer" by Gardner et al.; U.S. application Ser. No. 08/739,597 filed concurrently herewith, entitled "Trench Transistor In Combination With Trench Array" by Fulford, Jr. et al.; and U.S. application Ser. No. 08/739,567 filed concurrently herewith, entitled "Trench Transistor With Source Contact In Trench" by Gardner et al.; the disclosures of which are incorporated herein by reference.

The invention is particularly well-suited for fabricating N-channel MOSFETs, P-channel MOSFETs, and other types of IGFETs in conjunction with isolation trenches, particularly for high-performance microprocessors where high circuit density is essential. Although only a single IGFET and isolation trench have been shown for purposes of illustration, it is understood that in actual practice, many devices are fabricated on a single semiconductor wafer as widely practiced in the art. In particular, a single IGFET is often disposed between two isolation trenches (one near the source and the other near the drain), and a single isolation trench is often disposed between adjacent IGFETs. The invention can readily form an isolation trench between a pair of N-channel or P-channel MOSFETs, as well as between an N-channel and P-channel MOSFET in a CMOS process. Accordingly, the invention is well-suited for use in an integrated circuit chip, as well as an electronic system including a microprocessor, a memory, and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A method of forming an IGFET and an isolation trench, comprising the steps of:

simultaneously forming a transistor trench and an isolation trench in a substrate, wherein
   the transistor trench includes first and second opposing sidewalls and a first bottom surface, and the isolation trench includes third and fourth opposing sidewalls and a second bottom surface;

forming first and second spacers adjacent to the first and second sidewalls, respectively;

forming a gate insulator on the first bottom surface;

forming a gate electrode on the gate insulator and the spacers; and forming a source and a drain in the substrate and adjacent to the first bottom surface.

2. The method of claim 1, including forming third and fourth spacers adjacent to the third and fourth sidewalls, respectively, simultaneously with forming the first and second spacers.

3. The method of claim 2, wherein forming the first, second, third and fourth spacers includes depositing an insulative material over the substrate and into the trenches and then applying an anisotropic etch.

4. The method of claim 1, wherein forming the gate electrode includes depositing a polysilicon layer over the substrate and into the trenches, and then polishing the polysilicon layer until polysilicon regions in the trenches do not overlap a top surface of the substrate.

5. The method of claim 1, including filling the isolation trench with an insulator.

6. The method of claim 5, wherein filling the isolation trench with an insulator includes forming third and fourth spacers adjacent to the third and fourth sidewalls, respectively, and then depositing an insulative layer over the substrate and into the isolation trench.

7. The method of claim 6, wherein the insulative layer is undoped polysilicon.

8. The method of claim 6, wherein the insulative layer is silicon dioxide.

9. The method of claim 1, wherein the first and second bottom surfaces have essentially identical depths beneath a top surface of the substrate.

10. The method of claim 1, wherein a length between the first and second sidewalls is essentially identical to a length between the third and fourth sidewalls.

11. A method of forming an IGFET and an isolation trench filled with an insulator for providing device isolation for the IGFET, comprising the steps of:

simultaneously etching a transistor trench and an isolation trench in a semiconductor substrate, wherein the transistor trench includes first and second opposing sidewalls and a first bottom surface, the isolation trench includes third and fourth opposing sidewalls and a second bottom surface, and the first and second bottom surfaces have essentially identical depths beneath a top surface of the substrate;

simultaneously forming first and second spacers adjacent to the first and second sidewalls, respectively, and third and fourth spacers adjacent to the third and fourth sidewalls, respectively;

simultaneously forming a gate insulator on a central portion of the first bottom surface between the first and second spacers and an insulative region on a central portion of the second bottom surface between the third and fourth spacers;

depositing a gate electrode material over the substrate, on the first, second, third and fourth spacers, on the gate insulator and insulative region, and into the trenches;

polishing the gate electrode material such that a first portion of the gate electrode material in the transistor trench provides a gate electrode and a second portion of gate electrode material is in the isolation trench; and forming a source and a drain in the substrate, wherein the source is adjacent to the first bottom surface and the first sidewall and the top surface, and the drain is adjacent to the first bottom surface and the second sidewall and the top surface.

12. The method of claim 11, including:

forming a masking layer over the substrate that covers the transistor trench and exposes the isolation trench;

removing the second portion of the gate electrode material without removing the gate electrode;

stripping the masking material; and then depositing a second insulator into the isolation trench.

13. The method of claim 12, including polishing the second insulator until a top surface of the second insulator is planar and aligned with a top surface of the gate electrode.

14. The method of claim 12, including polishing the second insulator until a top surface of the second insulator is planar and above a top surface of the gate electrode, forming contact windows in the second insulator above the source, drain, and gate electrode, and depositing interconnect metallization in the contact windows.

15. The method of claim 11, including providing all doping for the source and the drain before simultaneously etching the trenches.

16. The method of claim 11, including providing doping for the source and the drain both before and after simultaneously etching the trenches.

17. The method of claim 11, including providing all doping for the source and the drain after simultaneously etching the trenches.

18. The method of claim 11, wherein a lightly doped region of the source spaced from the top surface provides a first channel junction beneath and adjacent to the first bottom surface, a lightly doped region of the drain spaced from the top surface provides a second channel junction beneath and adjacent to the first bottom surface, a heavily doped region of the source spaced from the first channel junction is adjacent to the first sidewall and the top surface, and a heavily doped region of the drain spaced from the second channel junction is adjacent to the second sidewall and the top surface.

19. The method of claim 11, wherein the IGFET is an N-channel MOSFET.

20. The method of claim 11, wherein the IGFET is a P-channel MOSFET.

21. A method of forming an IGFET adjacent to an isolation trench filled with oxide for providing device isolation for the IGFET, comprising the steps of:

providing a semiconductor substrate with a planar top surface;

forming a first masking layer over the substrate, wherein the first masking layer defines lateral boundaries for a transistor trench and an isolation trench;

applying a first anisotropic etch using the first masking layer as an etch mask to simultaneously form the transistor trench and the isolation trench in the substrate, wherein the transistor trench includes first and second opposing vertical sidewalls and a first bottom surface, the isolation trench includes third and fourth opposing vertical sidewalls and a second bottom surface, and the first and second bottom surfaces have essentially identical depths beneath the top surface;

stripping the first masking layer;

depositing a first oxide layer over the substrate so as to fill the trenches;

applying a second anisotropic etch to the first oxide layer to simultaneously form first and second oxide spacers adjacent to the first and second sidewalls, respectively, and third and fourth oxide spacers adjacent to the third and fourth sidewalls, respectively, such that a central portion of the first bottom surface between the first and second oxide spacers is exposed, and a central portion of the second bottom surface between the third and fourth oxide spacers is exposed;

simultaneously growing a gate oxide on the central portion of the first bottom surface and an oxide region on the central portion of the second bottom surface;

depositing a polysilicon layer over the substrate, on the first, second, third and fourth oxide spacers, and on the gate oxide and oxide region, so as to fill the trenches;

polishing the polysilicon layer until the polysilicon layer does not overlap the top surface and the polysilicon layer forms a polysilicon gate electrode in the transistor trench and a polysilicon region in the isolation trench, wherein the polysilicon gate electrode is electrically isolated from the substrate and substantially all of the polysilicon gate electrode is within the transistor trench;

forming a source and a drain in the substrate, wherein the source is adjacent to the first bottom surface and the first sidewall and the top surface, and the drain is adjacent to the first bottom surface and the second sidewall and the top surface;

providing a second masking layer over the substrate, wherein the second masking layer covers the transistor trench and exposes the isolation trench;

removing the polysilicon region from the isolation trench without removing the gate electrode from the transistor trench using the second masking layer as an etch mask;

stripping the second masking layer; and depositing a second oxide layer over the substrate so as to fill the isolation trench with oxide.

22. The method of claim 21, wherein the first and second masking layers are photoresist layers.

23. The method of claim 21, including forming the source and the drain before depositing the second oxide layer over the substrate.

24. The method of claim 21, wherein a length between the first and second sidewalls is essentially identical to a length between the third and fourth sidewalls.

25. The method of claim 21, wherein the source and the drain define a channel adjacent to and beneath the first bottom surface, and a length of the channel is less than one-half of a length between the first and second sidewalls.

* * * * *